Figure 1:
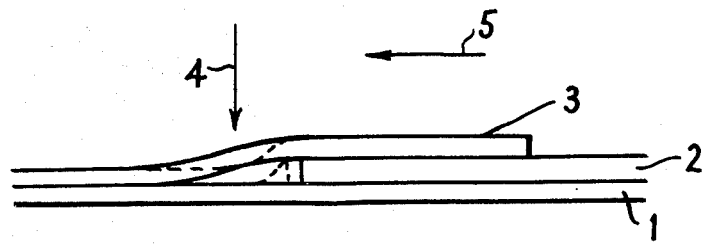

United States Patent [19]

Elworthy et al.

[11] Patent Number: 4,517,036
[45] Date of Patent: May 14, 1985

[54] MAKING OF PRINTING PLATES

[75] Inventors: John H. Elworthy, Bedfordshire; Donald Mayston, Suffolk, both of England

[73] Assignee: Protocol Engineering Limited, Berkhamsted, England

[21] Appl. No.: 527,204

[22] Filed: Aug. 29, 1983

Related U.S. Application Data

[63] Continuation of Ser. No. 281,274, Jul. 8, 1981, abandoned.

[30] Foreign Application Priority Data

Jul. 11, 1980 [GB] United Kingdom ............... 8022763

[51] Int. Cl.$^3$ ............................................. B32B 31/20
[52] U.S. Cl. ...................................... 156/64; 40/594;
156/91; 156/275.1; 156/290; 156/299; 156/499
[58] Field of Search ................. 40/594; 156/91, 272.4,
156/299, 499, 64, 290, 275.1

[56] References Cited

U.S. PATENT DOCUMENTS 3,645,823  2/1972  Merk et al. ..................... 156/299 X

FOREIGN PATENT DOCUMENTS

| 1522529 | 9/1969 | Fed. Rep. of Germany . |
| 2028262 | 12/1971 | Fed. Rep. of Germany . |
| 2024351 | 8/1970 | France . |
| 2153037 | 4/1973 | France . |
| 144028 | 12/1930 | Switzerland . |
| 534901 | 4/1973 | Switzerland . |
| 800669 | 8/1958 | United Kingdom . |
| 1128207 | 9/1968 | United Kingdom . |
| 1200479 | 7/1970 | United Kingdom . |
| 1284589 | 8/1972 | United Kingdom . |
| 1315489 | 5/1973 | United Kingdom . |
| 1375425 | 11/1974 | United Kingdom . |
| 1392560 | 4/1975 | United Kingdom . |
| 1422752 | 1/1976 | United Kingdom . |

Primary Examiner—Robert A. Dawson
Attorney, Agent, or Firm—Biebel, French & Nauman

[57] ABSTRACT

The present invention concerns the making of printing plates, particularly for litho printing. The invention involves assembling a montage of a plurality of individual films for exposure of the films to a printing plate. In order to assemble the montage a transparent, dry heat-sensitive adhesive coating is used on a carrier sheet and the films are bonded to the carrier sheet by this adhesive on the appropriate application of heat. The heat may be applied by a heating device according to the invention using a transistor as a heat source. Alternatively the assembled montage may be placed in a vacuum cabinet according to the invention, subjected to a vacuum to hold the films and carrier sheet together, and again have heat appropriately applied so that the adhesive bonds the film and sheet together. The heat may be generated by an HF source.

14 Claims, 9 Drawing Figures

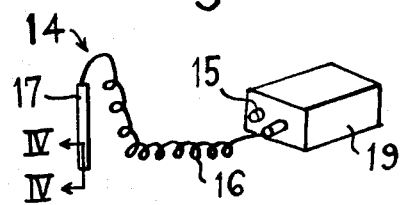
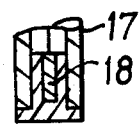
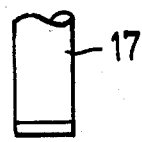
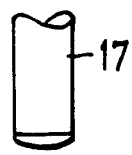
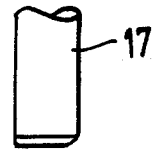
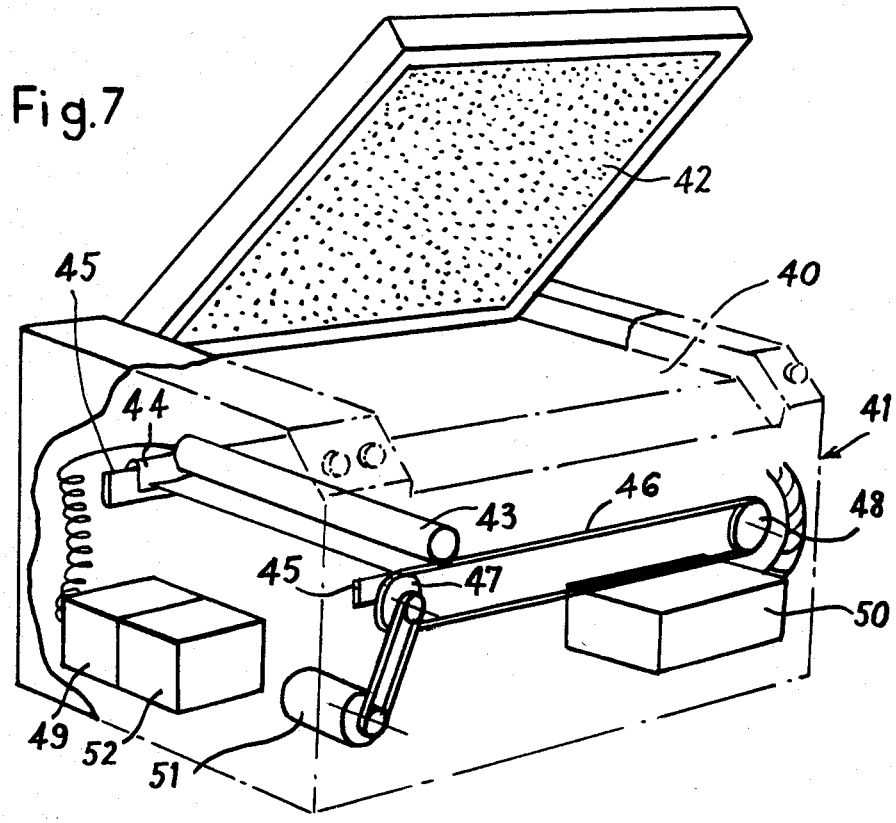

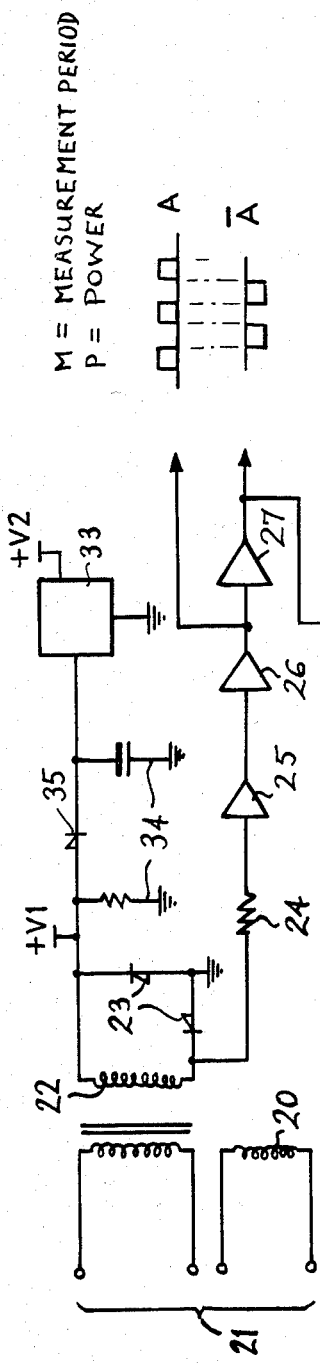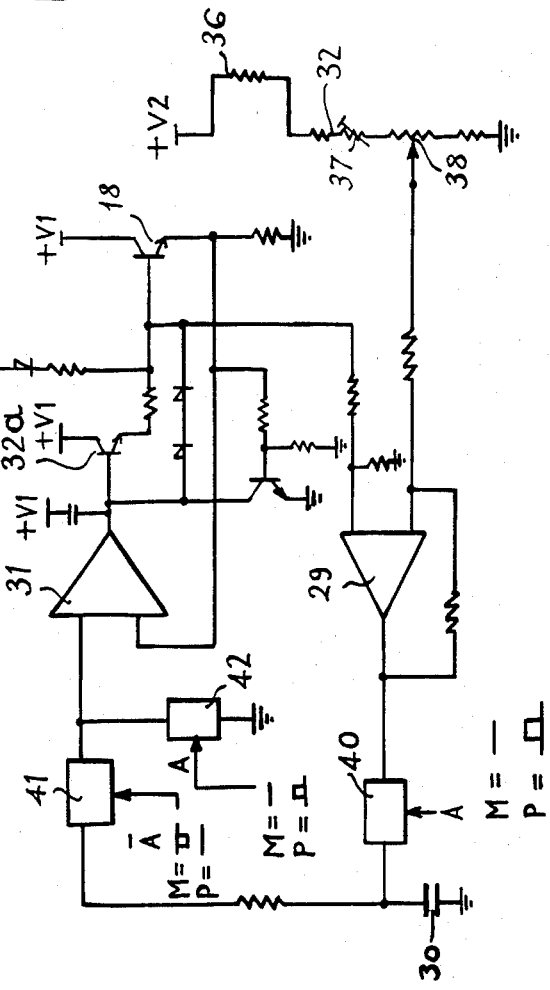
Fig.5

MAKING OF PRINTING PLATES

This is a continuation of Ser. No. 281,274 filed July 8, 1981, now abandoned.

The present invention relates to the making of printing plates, in particular for litho printing, and is primarily concerned with assembling a montage of a plurality of individual films for exposure of the films to a printing plate.

In the making of a printing plate, a montage is assembled by placing the various plastics films which have been developed after exposure in the camera-scanner or by contact on a transparent plastics montage foil in a layout which is determined by ruled-up positions on a layout sheet. The individual films are then secured in their positions in turn to the montage foil by bonding using pieces of transparent pressure-sensitive adhesive tape, such as "Scotch" tape. In certain cases, where there is insufficient space between the films to enable the adhesive tape to be used, a liquid adhesive is used for bonding instead. Such methods are in common usage both in the assembling of montages for multicolour printing where the images of the individual films for each colour have to be registered with one another, e.g. by the method described in the specification of our U.K. Pat. No. 1,128,207 or by so-called eye-glass montage using the blue film as a key, and in the assembly of montages for black and white printing. After assembly, the montage is then transferred to a vacuum frame containing the printing plate, in which it is "vacuumed down" onto the printing plate so as to obtain contact between the photographic emulsion on the films and the sensitised coating on the printing plate, during printing down. In colour printing, it is essential that accurate registration is maintained at all stages from camera to press, otherwise out-of-register printing will occur. At the montage and printing down stages, any movement of the individual films out of their secured positions can cause the images on the respective colour plates to be out of register during printing. Moreover, in both types of printing, if there is any loss of contact between the individual films and printing plate dot growth will occur resulting in loss of image quality.

Both the bonding methods mentioned previously suffer from considerable disadvantages. The pressure-sensitive adhesive tape must be kept clear of the actual images on the films, in order to guard against loss of contact between the film emulsion and the sensitized coating on the plate in the vacuum frame and even then the loss of contact can occur due to the additional layer formed by the adhesive tape between the films and the printing plate or due to "bubbling" of the films due to the trapping of air between the films and the montage foil arising from the use of adhesive tape. When there is only a small area of film outside the image, considerable time must be spent in cutting the adhesive tape to shape with the aid of a scalpel. Often the adhesive tape shrinks with age, suffers from migration or creep and softens, so that if a montage is stored for any length of time, which is often the case, the films move from their registered positions and loss of register occurs. In view of "creep" problems with pressure-sensitive adhesive tape, the montages are usually stored horizontally in drawers which can result in scratches or other damage to the montage which may be transferred to the printing plate. Furthermore, adhesive tape collects dirt on the edges and leaves a sticky deposit behind if, for any reason, the pieces of tape or the films have to be removed e.g. for retouching of the films and replaced. Indeed out of register can occur even in the act of applying the adhesive tape since, unless care is taken, movement of the film can be provoked.

If a liquid adhesive is used, and the films are removed from the montage for storage, or any other reason such as requiring retouching, the dried liquid adhesive will have to be cleaned from both the films and the montage foil. This is time consuming, and if done carelessly can damage either films or carrier sheets by introducing scratches which may appear upon the printing plate.

Another method of bonding films to montage foils has been tried but not adopted in view of the problems caused. This method involves the use of a montage foil having a transparent pressure-sensitive adhesive coating on one face thereof. Again this method is time consuming, the pressure-sensitive adhesive coating attracts dirt and dust and additional layers of non-sticky material have to be used to cover the area of the montage foil not covered by the films to avoid sticking to the printing plate during printing down.

Accordingly, the main object of the present invention is to provide a montage in which the aforesaid disadvantages are minimized or eliminated.

To this end and from one aspect, the present invention consists in a method of assembling a montage in the making of a printing plate, in which individual plastics films such as colour separations are adhesively bonded to a transparent plastics carrier sheet (montage foil), characterized in that the carrier sheet has a coating of a transparent, dry, heat-sensitive adhesive on one face thereof, the films are layed out on the adhesive coating and in that the films are bonded to the carrier sheet by the application of heat at a temperature which is sufficient to melt the coating momentarily without damaging the films and the carrier sheet.

The strength of the heat-sensitive adhesive is sufficient to hold the films for normal usage yet allow the films to be removed (stripped off) without damage, leaving the adhesive coating substantially intact on the carrier sheet ready for reuse. Thus, coherence of the molecules of the heat-sensitive adhesive for each other and for the carrier sheet is strong enough to avoid patches being removed if the films are stripped off. It will be appreciated that the plastics material of the carrier sheet should be compatible with or the same as that of the films.

By means of the invention, the individual films can be speedily attached to the carrier sheet but will retain their position as long as required, the films can easily be removed and be rapidly replaced after retouching and disadvantages arising from additional layers of tape at printing down are eliminated.

The heat may be applied manually by means of a heating device which is applied momentarily to the films at a plurality of locations on each film after positioning of the films and before removal to the vacuum frame for printing down.

Preferably, assembly of the montage includes drilling register holes in each film on a montage table having a flat smooth surface of non-conducting material such as polyethylene and locating each film in the correct position on the carrier sheet with register pins as described in the specification of our aforementioned patent. However, where a pin system is not employed, and the montage is being produced by laying down to a "blue key" using an eye-glass for image registration, the blue key can remain in position and a touch of the heating device in two positions will secure the film. It is quite easy to do this without removing the film.

In an alternative method of applying the heat in which register pins are used to hold the films in a located position in register on the carrier sheet, the entire montage complete with register pins may be transferred to a vacuum device which is operated so as to hold the films flat against the carrier sheet by removing all air therebetween and the heating is applied whilst the montage is under vacuum to bond the film to the carrier sheet.

With this method, even the possibility of any air being trapped between the films and carrier contact sheet with consequential loss of contact problems is virtually eliminated.

Any convenient means of heating may be employed with the vacuum device such as a programmable heating element or high frequency electromagnetic waves which would momentarily heat up the metal register pins in the montage to the melting point of the coating.

The invention also consists in a heating device for use in the assembly of a montage for bonding individual plastics films to a transparent plastics carrier sheet having a transparent, dry, heat-sensitive adhesive coating on one face thereof, said heating device comprising an electrical heating element having an applicator for contacting local areas of a film, the device being characterised in that it includes heat generating means in the form of a transistor, and means for controlling the operating temperature of the device in response to the base-emitter voltage of said transistor.

Finally, the invention also consists in a cabinet in which a montage of individual plastics films and a transparent plastics carrier sheet having a transparent dry, heat-sensitive coating on one face thereof can be mounted whereby the films can be bonded to the carrier sheet by the application of heat, the cabinet being characterised in that it includes vacuum means for applying a vacuum to the montage and heating means for heating the coating on the carrier sheet to bond the film to the sheet.

Figure 2:
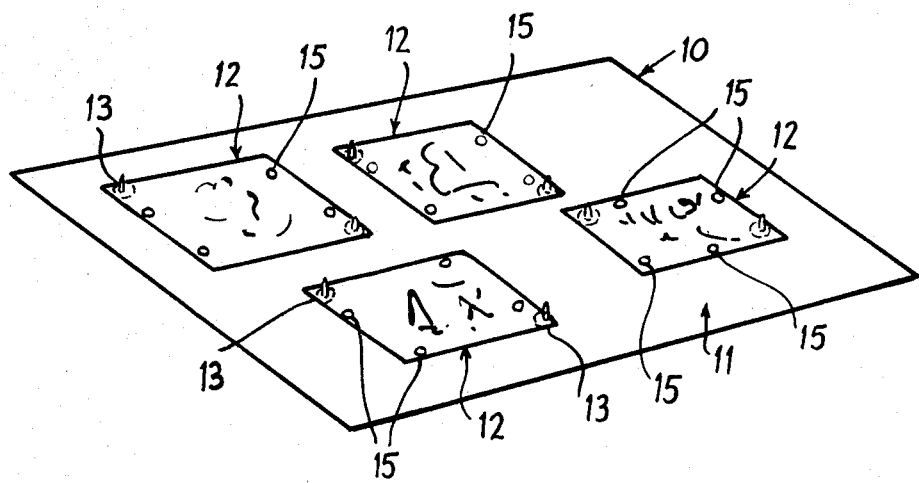

In order that the invention may be more readily understood, reference will now be made to the accompanying drawings, in which:

FIG. 1 is a side view of part of a montage showing one of the prior art methods of bonding films to a carrier sheet, FIG. 2 shows one way of carrying out the method according to the invention, FIG. 3 is a diagrammatic representation of one form of heating device used in the method shown in FIG. 2, FIG. 4 is a sectional view on line IV—IV of FIG. 3, FIG. 5 is a circuit diagram of the current controlling the temperature of the heating device of FIG. 3, FIG. 6 shows three alternative forms the applicator end of the heating device of FIG. 3 may take, and FIG. 7 is a section of a vacuum cabinet showing another way of carrying out the method according to the invention.

Referring to FIG. 1 of the drawings, this shows part of a carrier sheet constituting a montage foil 1 to which a photographic film 2 (only part shown) is bonded by means of pieces of pressure-sensitive adhesive tape of which one piece is shown at 3. If, when the adhesive tape is applied, undue pressure is exerted in the direction of the arrow 4, then the film moves in the direction of the arrow 5 so that the film is out of register. This illustrates just one of the disadvantages of using pressure-sensitive adhesive tape in the assembling of a montage.

In FIG. 2, a montage consists of a carrier sheet constituting a montage foil 10 of a transparent plastics material such as polyester e.g. that sold under the various Trade Marks of ICI such as MELINEX, which material is dimensionally stable. The montage foil 10 has a coating 11 on its upper face (as shown) of a transparent, dry, heat-sensitive adhesive. Four films e.g. of polyester constituted by colour separations 12 have different images thereon and represent one colour to be used in the making of one of the printing plates in a four-colour printing process. These colour separations have been previously put in register with the colour separations of three other colours on three other montage foils using the method and apparatus described in our U.K. Pat. No. 1,128,207, with the aid of flat-headed register pins 13 which pass through register holes drilled in the montage foil and the separations. By applying the heating device which is generally indicated at 14 in FIG. 3, to four different areas of each of the separations 12 in turn, the adhesive coating 11 is melted to bond the separations to the montage foil, where indicated at 15. The melting point of the transparent, heat-sensitive adhesive coating 11 is above the ambient temperature, i.e. above that temperature at which the adhesive would melt for all normal usage and storage of the montage but below that temperature which would cause damage to the montage foil and separations. Once the separations 12 have been bonded to the montage foil 10, the register pins 13 are removed and the montage is then taken to a vacuum frame for printing down to the printing plate. It will be appreciated that contact between the photographic emulsion of the separations and the sensitized coating of the printing plate is considerably improved compared with that of the montage in FIG. 1 since, when the vacuum is applied, prior to printing down, there is no additional layer 3 of adhesive tape between the plate and the separations.

The heating device 14 shown in FIG. 3 is arranged to operate at a temperature which corresponds to that of the melting point of the heat-sensitive adhesive coating 15 so that it does not damage the separations or the montage foils. The heating device 14 is preferably operated by electricity via a push-button operated switch 15 and a lead 16 connected to a power/control unit 19. The lead 16 is connected to a handle 17 which is grasped by the person who is assembling the montage, and which carries an electric heating element in the form of a transistor 18 (see FIG. 4). One end of handle 17 constitutes an applicator for contacting localised areas of the separations 12.

FIG. 5 of the accompanying drawings shows a control circuit for controlling the temperature of the transistor 18 fitted at the applicator end of handle 17 of the heating device 14. In the conventional use of semi-conductors, the heating effect is potentially dangerous to the life of the component and consequently heat sinks are fitted to the more powerful seni-conductors to dissipate unwanted heat.

However in the embodiment being described the heat generated within transistor 18 is essential to the operation of the device.

The temperature rise of transistor 18 is a function of its base-emitter voltage. Since the value of this voltage can be related directly to temperature, this inherent characteristic is used in the control circuit to be described to control and maintain the temperature of the transistor, and thus of the applicator end of the heating device 14, at a predetermined value.

Thus, FIG. 5 shows a transformer 20 connectable to a mains supply 21 and having an output winding 22 the output of the transformer being rectified by diodes 23 to produce a half-wave supply. The half-wave supply so formed allows control and power circuits for the heating device 114 to operate alternately with measurement control periods taking place between the half-waves. Thus in the control circuit for transistor 18 the rectified half-wave supply is taken via a resistor 24 and a chain of CMOS inverters 25, 26, 27 and 28 to the base-emitter junction of transistor 18. The current from inverter 28 passing through the base-emitter junction of transistor 18 produces a base-emitter voltage which is related to the temperature of the transistor. This voltage is compared with a reference voltage by a differential amplifier 29 and the output signal from amplifier 29 is stored in a capacitor 30. When a power cycle commences capacitor 30 discharges into one input of a differential amplifier 31 the output of which drives a transistor 32a which in turn drives transistor 18, feedback being taken from the emitter of transistor 18 into the other input of amplifier 31.

The reference voltage supplied to differential amplifier 29 is taken from a voltage divider circuit generally indicated at 32, circuit 32 being supplied with a voltage V2 taken from the output of a circuit 33 connected to transformer winding 22 via an RC network 34 and a diode 35. The voltage divider circuit 32 includes a resistor 36 which is a discrete component whose value is matched to the characteristics of transistor 18. This resistor is located in a plug attached to the applicator to ensure that the power unit and applicator are interchangeable. The voltage divider circuit also includes a variable resistance 37 and a tapping 38 from which the reference voltage is drawn. A voltage V1 drawn from winding 22 is supplied to the collectors of transistors 18 and 32a.

The timing of the measurement and power periods is carried out by means of CMOS analogue switches 40, 41 and 42. Switches 40 and 42 are controlled by signals taken from the output of inverter 26 and switch 41 by the output signal of inverter 27. The outputs from these inverters are shown in the waveforms accompanying the three switches in FIG. 5, and measurement periods are shown as "M" in FIG. 5, with power periods being shown as "P".

Thus during a measurement/control period a base-emitter voltage must be produced from inverter 28 and this is done by signal $\overline{A}$ from inverter 27. Signal $\overline{A}$ is also used to isolate capacitor 30 from amplifier 31. At the same time signal A, which is an inversion of signal $\overline{A}$, is used to connect the output of amplifier 29 to capacitor 30. Furthermore amplifier 31 is provided to ensure that transistor 32a is switched off.

During a power period capacitor 30 is connected to amplifier 31 by signal $\overline{A}$ on switch 41, signal A at switch 42 isolating amplifier 31 from ground and isolating amplifier 29 from capacitor 30.

The use of mains frequency at 50 Hertz (or 60 Hertz), to produce alternate measuring and power periods produces a device whose response to temperature variations is very fast.

FIGS. 6a, b and c show three different forms of the applicator end of which that shown in FIG. 6a is completely flat whereas that of FIG. 6b is curved and that of FIG. 6c is flat and has a radiused edge.

In the method shown in FIG. 7 a montage 40 similar to that shown in FIG. 2, and complete with register pins is placed, before bonding, in a cabinet 41. The montage 40 will be supported appropriately. A lid including a vacuum blanket 42 is lowered over the mounted montage 40 and locked into position. The closing of the lid initiates automatically a sequence of operations the first of which is the production of a vacuum within the cabinet by pump means generally indicated at 50.

When a vacuum has been produced within the cabinet 41 it will hold the separations flat against the montage foil. Housed in the cabinet 41 below the montage 40 is a radio frequency induction coil 44 mounted on a carriage 44 which runs on a pair of parallel rails 45. Secured to the carriage 44 is the upper run of an endless belt or wire 46 extending around a pair of pulley wheels 47, 48, the pulley wheel 47 being driven via a belt by an electric motor 51. The coil 43 is connected to a radio frequency power source 49. When in operation the coil 43 passes beneath the montage the electromagnetic field that it generates will interact with the steel register pins to raise their temperature so that the heat generated by the pins will cause the film of the montage to bond to the foil under vacuum wherever a pin is fitted.

After actuation of the vacuum pump means 40 by closure of the lid, and after the pressure in the cabinet has been reduced by an appropriate amount as measured by an appropriate sensor or by an appropriate period after switching on of the vacuum pump means, a control circuit 52 causes power circuit 49 to provide R.F. energy to the coil 43 and also causes motor 51 to drive pulley 47 so that the coil is traversed beneath the montage. When the coil has completely traversed the montage the carriage 44 triggers a microswitch reversing the motor 51 which then returns the carriage 44 and coil 43 to their initial position. Their return is also sensed at which point the R.F. energy for the coil 43 is switched off, the vacuum pump means 50 are switched off, and the lid of the cabinet 41 unlocked so that the montage can be removed.

It will be appreciated that other forms of drive means for traversing the coil involving known linear actuators may be employed.

It will also be appreciated that the cabinet 41 will be appropriately shielded to prevent the R.F. energy radiated by the coil 43 escaping from the cabinet. The cabinet may be provided with control means enabling the rate of traversal of the coil to be varied.

The methods described eliminate register errors caused by "creep", of the films on the montage foil due to deterioration of the pressure-sensitive tape, particularly if the montage is stored vertically, the need for horizontal storage so that it is possible to use modern vertical filing systems with speedy access facilities, and scratches and damage to montages caused by horizontal storage in drawers. There is a considerable time saving in assembling the montage since individual pieces of tape do not have to be used, and out of contact problems during printing down are avoided. Economies can be made of film due to the margin for pressure-sensitive adhesive tape not being needed, there is a possibility of paper saving due to the facility for assembling films for jobs such as post cards, there is a saving in cost since pressure-sensitive adhesive tape is no longer required and small pieces of film not readily secured by pressure-sensitive adhesive tape can be speedily fixed to the montage foil.

It will be appreciated that the invention also consists in a montage assembled by any of the methods described herein. A suitable heat-sensitive adhesive combined with a plastics film for use in the methods by ICI Limited, and is now sold under the trademark "Agralon Protostik" by Agraprinta-Griffin's, 20 Briton Street, London, England.

Various modifications may be made without departing from the scope of the invention.

We claim:

1. A method of assembling a montage, for example in making a printing plate, said method comprising the steps of:
   (1) applying a dry heat-sensitive adhesive coating which does not exihibit any tacky characteristics at ambient temperatures even if pressure is applied theeto to one face surface of a carrier sheet,
   (2) positioning at least one sheet-like member on said carrier sheet face surface in a predetermined register position and in overlying relation to said adhesive coating to provide a montage, and
   (3) applying localized heating to the montage at any desired locations where said sheet-like member is positioned at selected localized areas, said localized heating having a temperature sufficient to melt at such localized areas only said adhesive coating without damage to said sheet-like member or to said carrier sheet, whereby to provide a montage in which said sheet-like member is bonded by solid, dry adhesive bonds to said carrier sheet at said localized areas only and in which any area of said adhesive coating which is not covered by said sheet-like member remains dry and still exhibit said non-tacky characteristics, and whereby said solid dry bonds are breakable to permit said sheet-like member to be removed without heating from said carrier sheet leaving said dry adhesive coating substantially intact thereon at said localized areas.

2. The method as claimed in claim 1, characterized in that said carrier sheet and said sheet-like member are of compatible plastic materials and in that said heat-sensitive adhesive, after said localized heating, has a greater coherence for said carrier sheet than for said sheet-like member.

3. The method as claimed in claim 1, characterized in that said localized heating is applied by means of an electrical heating device having an applicator end which provides localized areal contact with said montag.

4. The method as claimed in claim 1, characterised by the steps of providing a montage table having a flat smooth surface of a non-conducting material such as polyethylene and supporting the carrier sheet on said surface with said adhesive coater uppermost, and in that said sheet-like member is positioned in register on said adhesive coating of said carrier sheet face surface by drilling register holes in said sheet-like member and said carrier sheet and passing register pins through the register holes in said sheet-like member and said carrier sheet.

5. The method as claimed in claim 3, characterized in that said electrical heating device has a heat generating means in the form of a transistor and means for controlling the operating temperature of the device in response to the base-emitter voltage of said transistor.

6. The method as claimed in claim 3, characterized in that the heating device is applied manually to said montage at said localized areas.

7. The method as claimed in claim 5, and further characterized in that the heating device has a control circuit comprising means for generating a rectified half-wave supply for application to the base emitter junction of said transistor, means for comparing the base emitter voltage of said transistor with a reference voltage and means for controlling said transistor in response to said comparison.

8. The method as claimed in claim 7, and further characterized in that the heating device comprises a transformer connectable to a main power supply, diode means for rectifying the output of said transformer to generate said rectified half-way supply, a voltage divider to which an output from said transformer is supplied to generate said reference voltage, and a differential amplifier to which said reference voltage and the base-emitter voltage of said transistors are supplied for comparison purposes.

9. The method as claimed in claim 8, and further characterized in that the output of said differential amplifier is connected to capacitor means dischargeable into one input of a second differential amplifier is connected to capacitor means dischargeable into one input of a second differential amplifier the second input of which receives a feedback signal from said transistor, the output of said second differential amplifier being connected to a second transistor for driving the first mentioned transistor so that it generates heat.

10. The method as claimed in claim 1, characterized in that said localized momentary areal heating is applied by means of a heating device which is controlled by a computer.

11. A method of assembling a montage, for example in making a printing plate, said method comprising the steps of:
   (1) applying a dry heat-sensiive adhesive coating which does not exhibit any tacky characteristics at ambient temperature even if pressure is applied thereto to one face surface of a carrier sheet,
   (2) positioning at least one sheet-like member on said carrier sheet face surface in a predetermined register position and in overlying relation to said adhesive coating by forming register holes in said sheet-like member and said carrier sheet and passing register pins through the register holes in said sheet-like member and said carrier sheet to provide a montage,
   (3) transferring the montage to a vacuum device,
   (4) operating the vacuum device to hold said sheet-like member flat against the carrier sheet by removing all air therebetween, and
   (5) applying localized heating to the montage while it is under vacuum at any desired locations where said sheet-like member is positioned at selected localized areas, said localized heating having a temperature sufficient to melt at such localized areas only said adhesive coating without damage to said sheet-like member or to said carrier sheet, whereby to provide a montage in which said sheet-like member is bonded by solid, dry adhesive bonds to said carrier sheet at said localized areas only and in which any area of said adhesive coating which is not covered by said sheet-like member remains dry and still exhibits said non-tacky characteristics.

12. The method as claimed in claim 11, characterized in that said carrier sheet and said sheet-like member are of compatible plastic materials and that said heat-sensitive adhesive, after said localized heating, has a greater coherence for said carrier sheet than for said sheet-like member.

13. The method as claimed in claim 11, and further characterized in that said register pins are of metal and in that said localized momentary area heating is carried out by high-frequency electromagnetic waves which momentarily heat up the metal register pins in the montage to the melting point of the coating.

14. The method as claimed in claim 13, and further characterized in that said electromagnetic waves are emitted by a high frequency induction coil and by the further step of traversing the coil below the montage in the vacuum device.

* * * * *